United States Patent [19]

Nakai et al.

[11] 4,064,030
[45] Dec. 20, 1977

[54] PROCESS FOR SURFACE TREATING MOLDED ARTICLES OF FLUORINE RESINS

[75] Inventors: Junkichi Nakai, Minoo; Kazuo Fukunaga, Ibaraki, both of Japan

[73] Assignee: Nitto Electric Industrial Co., Ltd., Ibaraki, Japan

[21] Appl. No.: 676,784

[22] Filed: Apr. 14, 1976

[30] Foreign Application Priority Data

Apr. 14, 1975 Japan .................................. 50-45620

[51] Int. Cl.² ............................................ C23C 15/00
[52] U.S. Cl. ............................... 204/192 E; 204/298; 428/421
[58] Field of Search ...................... 204/192 E, 192 EC

[56] References Cited

U.S. PATENT DOCUMENTS 3,617,354  11/1971  Carnahan et al. ................ 204/192 X

OTHER PUBLICATIONS

C. Weissmantel et al., "Interaction of Ion Beams with Polymer Surfaces Leading to Etching and Sputtering Processes," Japan J. Appl. Phys. Suppl. 2, Pt. 1, (1974), pp. 439-442.

M. Rost et al., "Ion-Beam Etching and Sputtering of Polytetrafluoroethylene (PTFE)", Thin Solid Films, 20, 515-519 (1974).

D. T. Morrison et al., "RF Sputtering of Plastics", Thin Solid Films, vol. 15, pp. 87-101 (1973).

A. I. Akishin et al., "The Atomisation of Polymers by Argon, Helium, and Hydrogen Ions with Energies Up to 30 KeV", Russian J. Phys. Chem., vol. 39, No. 12, Dec. 1965, p. 1637.

M. Rost et al., "Ion-Beam Etching and Sputtering of Polytetrafluoroethylene", Chem. Abstr. 81, 78356n (1974).

*Primary Examiner*—G. L. Kaplan
*Assistant Examiner*—Aaron Weisstuch
*Attorney, Agent, or Firm*—Sughrue, Rothwell, Mion, Zinn and Macpeak

[57] ABSTRACT

The surface of a molded article of a fluorine resin is treated to provide better adhesion by sputter etching it in an atmosphere whose pressure is maintained at about 0.0005 to about 0.5 Torr.

17 Claims, 15 Drawing Figures

PROCESS FOR SURFACE TREATING MOLDED ARTICLES OF FLUORINE RESINS

BACKGROUND OF THE INVENTION

1. Field of the Invention

This invention relates to a method for surface treating a chemically inert molded article of a fluorinated olefin polymer.

2. Description of the Prior Art

Molded articles of fluorinated olefin polymers, such as films, sheets, tapes or cloths, are widely used because of their superior properties such as electrical characteristics, thermal characteristics and chemical resistance, but they have the defect that since their surface is inert, they exhibit low adhesion so good adherance of adhesives, paints, inks, etc., is hard to obtain and composites with other materials are difficult to obtain.

In conventional techniques, the surface of such a molded article is treated, for example, by a physical roughening of the surface, or by glow discharge. Such a physical surface treatment, however, scarcely improves the surface of a molded product of a fluorinated olefin polymer typified by a polytetrafluoroethylene molded article. Furthermore, by a glow discharge, the degree of improvement of the surface of the molded article is far inferior to that of a fluorine-free polymer such as polyethylene.

When it is desired to obtain a strongly adhesive surface, the only treatment method now commercially available is one comprising immersing a fluorinated olefin molded article into a solution of an alkali metal such as metallic sodium in a mixture of naphthalene and tetrahydrofuran or in liquid ammonia. However, in this method the alkali metal used creates the risk of fire during treatment, and handling of the used treating liquor also poses problems. Furthermore, since the treated surface of the molded article turns brown, its commercial value is lowered, and its surface electrical resistance is reduced. Another defect is that the treating effect (surface adhesion) is drastically reduced when the treated surface of the molded article is exposed to ultraviolet light or left to stand at elevated temperatures.

SUMMARY OF THE INVENTION

Accordingly, it is one object of this invention to provide a novel method for surface treating a molded article of a fluorinated olefin polymer.

Another object of this invention is to obtain a molded article which exhibits an excellent surface treatment effect, especially a sheet-like article, of fluorinated olefin polymer which has superior adhesion to materials such as adhesives, paints or inks, and which can form useful composites with the above materials.

Still another object of this invention is to obtain such a useful sheet like material continuously.

We have performed extensive research in view of the above circumstances, and found that when a molded article of a fluorinated olefin polymer is subjected to sputter etching while maintaining the pressure in the sputter etching atmosphere at about 0.0005 to about 0.5 Torr, the treated surface has superior adhering properties which are not attainable with a conventional glow discharge treatment, and the various defects inherent to the above mentioned treatments with chemicals are removed. This led to the accomplishment of the present invention.

BRIEF DESCRIPTION OF THE DRAWINGS

FIGS. 7 and 11 are photographs on a scale of 4000 X which show the surface condition of a fluorinated olefin polymer sheet subjected to sputter etching.

DETAILED DESCRIPTION OF THE INVENTION

The method of this invention is applicable with good results to molded articles of α-fluroolefin polymers, particularly those polymers prepared from perfluorinated α-fluoroolefin monomers or α-fluoroolefin monomers containing hydrogen atoms as well as fluorine atoms.

The α-fluoroolefin has 2 to 6, preferably, 2 to 4 carbon atoms. Examples of suitable α-fluoroolefin include perfluorinated α-fluoroolefins such as tetrafluoroethylene, hexafluoropropene, perfluorobutene-1, perfluoroisobutene and the like, and hydrogen containing α-fluoroolefins such as trifluoroethylene, vinylidene fluoride, vinyl fluoride, pentafluoropropane, etc.

In this invention, halogen containing α-fluoroolefins such as trifluorochloroethylene, 1,1-difluoro-2,2-dichloroethylene, 1,2-difluoro-1,2-dichloroethylene, trifluorobromoethylene, etc., and perfluoroalkoxyethylene polymers can also be used. Further, if desired, copolymers consisting of two or more α-fluoroolefins, halogen containing α-olefins and perfluoroalkoxyethylene or copolymers obtained by copolymerizing therewith an olefin having 2 to 6 carbon atoms, particularly ethylene copolymerized therewith, can be employed.

The above described polymers and copolymers used in this invention have a molecular weight of about $1 \times 10^4$ to about $1 \times 10^7$, practically preferably about $2 \times 10^4$ to about $1 \times 10^7$, and a fluorine content of about 40 to about 76 wt%, preferably about 50 to about 76 wt%, based on the polymer or copolymer.

Especially superior results are obtained when the method of this invention is applied to a molded article of polytetrafluoroethylene or a fluoroethylene/propylene copolymer. Usually, the copolymerization proportion of hexafluoropropylene to tetrafluoroethylene in the fluoroethylene/propylene copolymer used in this invention is 15 to 25: 85 to 75 (wt%).

Molded articles obtained by molding a mixture of a fluorinated olefin polymer and a filler such as a molybdenum powder, bronze powder or graphite or a pigment such as titanium white, carbon black, etc., having a particle size of below about 1 micron can also be surface treated by the method of this invention to attain superior adhering properties, and are therefore embraced within the molded articles of fluorinated olefin polymers as contemplated in the present application.

Further, with the method of this invention the surface of a composite sheet such as that consisting of fluorinated olefin polymer sheet and another plastic sheet or the surface of a fluorinated article obtained by fluorinating the surface of a plastic sheet (cf.,e.g., Japanese Patent Application 95197/1972) can also be sputter etched.

The sputter etching of a fluorinated olefin polymer molded article by the method of this invention can be carried out using a pressure reduction chamber internally equipped with an anode and a cathode which is capable of being evacuated. Examples of anode or cathode material include metal plates, e.g., stainless steel plate (e.g., TYPE 304 prescribed in ASTM 276-70), aluminum plate, copper plate, etc. The fluorinated olefin polymer molded article is brought in contact with the cathode, and, in this state, an alternating current power, such as high frequency power, is applied between the two electrodes to perform discharging while maintaining the pressure of the atmosphere at about 0.0005 to about 0.5 Torr.

Since in the method of this invention the discharging is carried out while the fluorinated olefin polymer molded article is in contact with the cathode, the discharge treatment is effected in a cathode dark space of very high ion energy levels within the discharge zone. The ion energy in the cathode dark space is about 10 to about 100 times as great as that of a glow discharge where the discharge occurs in plasma, although it varies according to the pressure of the atmosphere during the discharge. For this reason, the surface treatment of the fluorinated olefin polymer molded article can be performed with good results within short periods of time, e.g., about 1/10 to about 1/100 as long as that required for conducting a conventional glow discharge treatment; within this time range equivalent or better effects than those attained in conventional methods are obtained.

The pressure of the atmosphere at the time of sputter etching is about 0.0005 to about 0.5 Torr at room temperature ($-10°$ to $40°$ C), preferably 0.001 to 0.15 Torr, especially preferably 0.005 to 0.01 Torr. When the pressure is less than about 0.0005 Torr, discharging for effecting sputter etching cannot be performed continuously, while when it is above about 0.5 Torr, the speed of etching is markedly reduced and discharging becomes unstable.

Other sputter etching conditions are as follows: Usually, high frequency (about several hundred KHz to several ten MHz) can be used, but for commercial purposes, a frequency of 13.56 MHz easily available as a commercial frequency is used. The discharge power is usually about 0.1 to about 20 Watt/cm$^2$, preferably 0.1 to 10.0 Watt/cm$^2$, especially preferably 0.1 to 5.0 Watt/cm$^2$. The treating time should be made longer when the discharge power is smaller. It is desirable to increase the discharge power and shorten the treating time. The degree of surface treatment is expressed substantially as the product of the discharge power and the treating time, and is usually about 1 to about 1000 Watt.sec/cm$^2$, preferably 5 to 500 Watt.sec/cm$^2$, especially preferably 80 to 300 Watt.sec/cm$^2$.

For example, when the discharge power is 0.5 Watt/cm$^2$, the treating time is at least 5 seconds, preferably at least 10 seconds, and up to about 15 minutes.

The required minimum distance between the electrodes is substantially proportional to $1/\sqrt{P}$, in which $P$ is the pressure in Torr, and is at least about 30 mm, for example, when the pressure of the atmosphere is 0.005 Torr. The distance between the electrodes is practically from about 40 mm to about 500 mm in view of the largeness of apparatus used, although such is not limited theoretically.

All gases can be used as the atmosphere for the sputter etching, but highly active gases such as chlorine gas or fluorine gas, or organic gases such as styrene, trichlorobenzene, vinylferocene, etc., which polymerize by discharge at the time of sputter etching or such gases as will corrode the apparatus or pollute the environment, e.g., HCl, NOx, etc. are best avoided.

For commercial operation, inert gases such as helium, argon, nitrogen, etc. are used.

Furthermore, according to the present invention, the discharge treatment can be performed in the presence of only the gas resulting from the decomposition of the fluorinated olefin polymer by discharging without feeding any other gas into the pressure reduction chamber during the discharge treatment (i.e., while the discharge treatment is in progress).

The invention will further be described by reference to the accompanying drawings.

Figure 1:
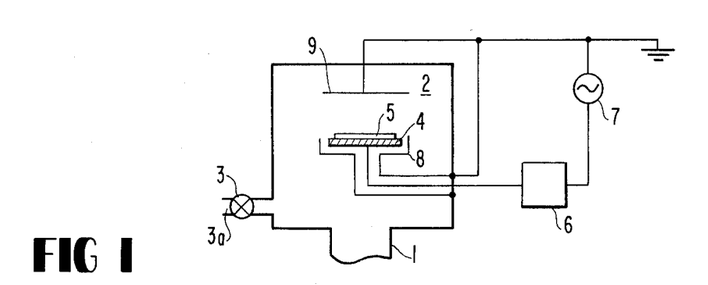
FIGS. 1 to 4 are schematic views showing examples of an apparatus used for the surface treatment in accordance with the present invention.

Referring to FIG. 1, reference numeral 1 represents an exhaust pipe connected to a vacuum pump (not shown) so as to exhaust gases from a pressure reduction chamber 2; 3 is a valve for introducing a gas into the pressure reduction chamber 2 via conduit 3(a); 4 is an electrode for sputter etching of a fluorinated olefin polymer molded article 5, which is connected to a matching box 6 (an impedance matching device provided with capacitor 6' both not shown and inductance 6'') by means of the lead wire shown which is electrically insulated and sealed air-tight, and is further connected to a high frequency electric source 7 by the connections shown; 8 is a shielding electrode for the electrode 4, which is connected to the ground side of the high frequency electric source 7 by the connections shown; and 9 is an opposing electrode connected to the ground side of the high frequency source 7 by the connections shown. The pressure reduction chamber 2 serves to maintain the pressure of the atmosphere constant. When it is made of a metallic vessel, it is connected to the ground side of the high frequency source 7. The matching box 6 is a circuit device composed of capacitor 6' and inductance 6'', and performs impedance matching. When the potential of the electrode 4 is negative with respect to the electrode 9, the positive ions resulting from the discharge are accelerated and impinge against the surface of the fluorinated olefin polymer molded article 5 to thereby perform sputter etching of the surface. Since the positive charge of the impinged positive ions builds up on the surface of the molded article 5 to increase the surface potential, the difference in potential between the surface and the electrode 9 is reduced and it is difficult to maintain discharging. However, in a half cycle of the high frequency voltage, the potential of the electrode 4 with respect to the electrode 9 becomes positive. Hence, an electron enters the surface of the molded article 5 from the discharge space to neutralize the positive ions built up on the surface due to the negative charge of the electron. As a result, in the next half cycle of the high frequency voltage, when the potential of the electrode 4 with respect to the electrode 9 becomes negative, the difference in potential between the electrodes becomes large enough to permit discharge. The resulting positive ions are accelerated and impinge against the surface of the molded article 5 to effect sputter etching. The above actions are repeated in every cycle of the high frequency voltage so as to sputter etch the surface of the molded article 5.

Figure 2:
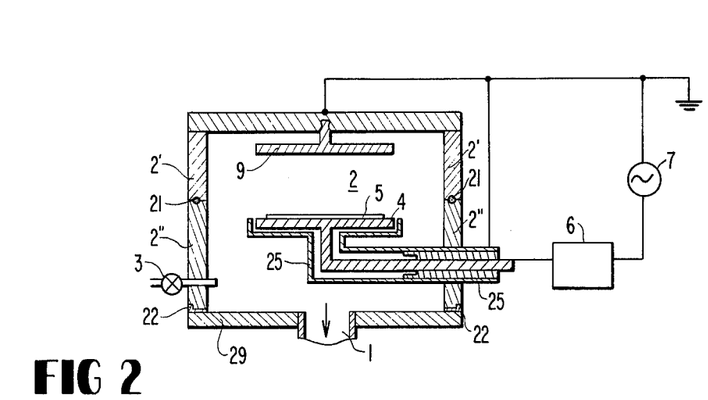
Figure 2:
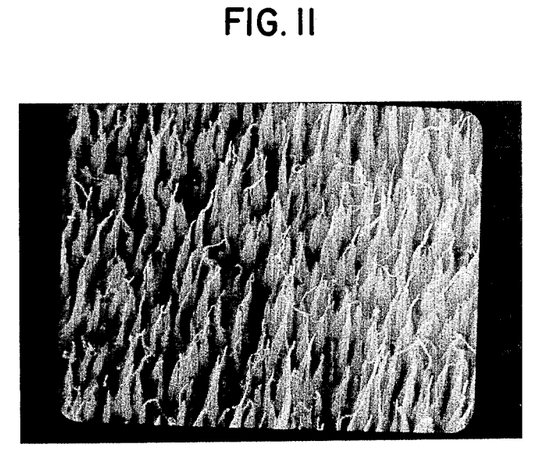

The apparatus shown in FIG. 2 is drawn in greater detail than the schematic view of FIG. 1, though like numerals are used to identify like elements. In FIG. 2, reference numeral 21 represents a packing for sealing the walls 2' and 2" of the pressure reduction vessel. Wall 2' is adapted to be opened when the fluorinated olefin polymer molded article is placed into or removed from the vessel 2. Reference numeral 22 represents an L-shaped gasket used to seal the wall 2" to base plate 29. Reference numeral 25 represents a ceramic insulating pipe for insuring mechanical strength as well as achieving sufficient electrical insulation.

One example of the treatment of the present invention will now be briefly described.

The molded article comprising sheet 5 is placed on the electrode 4 in FIG. 1, and the pressure inside the pressure reduction vessel 2 is reduced to $1 \times 10^{-5}$ Torr by means of the vacuum pump. Then, the desired atmosphere is introduced through valve 3 and the pressure of the gas is adjusted to $1 \times 10^{-2}$ Torr. The high frequency source is controlled so that the discharge power becomes 0.5 Watt/cm$^2$, and sputter etching of the surface of the molded article is performed for several seconds to several tens of seconds.

Figure 3:
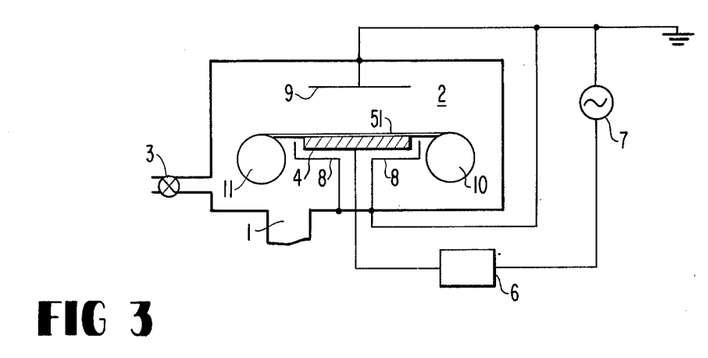

In order to perform the surface treatment of the sheet 5 continuously, a sheet take-up and drive device is provided within the pressure reduction vessel 2, as shown in FIG. 3. In FIG. 3, reference numeral 51 represents the sheet of fluorinated olefin polymer; 10, a feed roll; and 11, a take-up roll.

Figure 4:
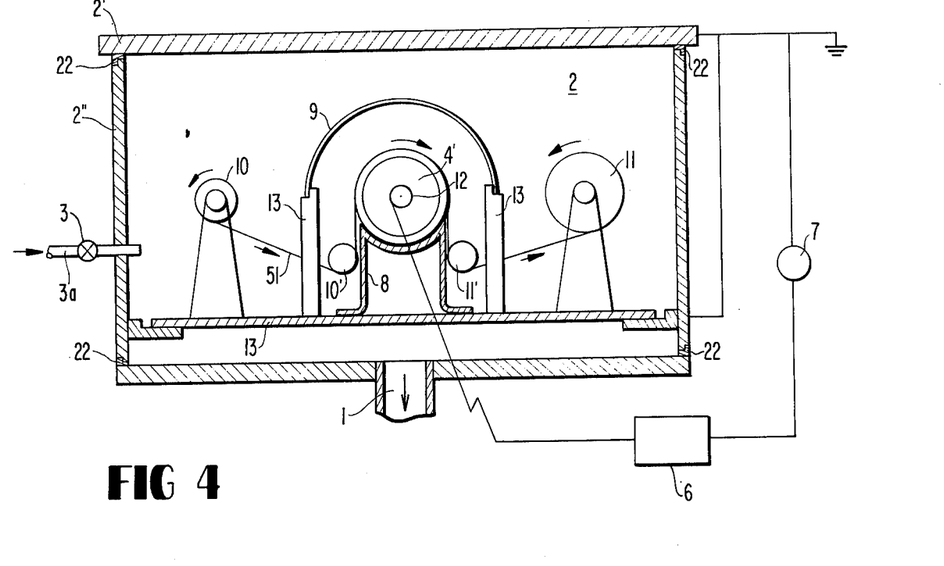
Figure 5:
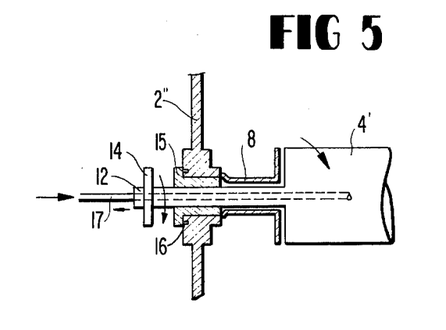
FIG. 5 is a sectional view of the principal parts of the apparatus shown in FIG. 4.

FIG. 4 shows another example of apparatus for continuously performing the surface treatment of a sheet of a fluorinated olefin polymer. The principal parts of the apparatus of FIG. 4 are shown in FIG. 5. In FIG. 4, the walls 2' and 2" of the pressure reduction vessel permit the evacuation of the vessel 2 through exhaust pipe 1, and a gas can be introduced via conduit 3(a) and valve 3 and the system maintained at constant pressure. Reference numeral 22 represents an L-shaped gasket. The anode 9 is supported by metallic support bars 13 and connected to the ground side of the high frequency source 7 through the walls of the pressure reduction vessel. The sheet 51 passes from feed roll 10 to an intermediate roll 10', and contacts a rotary roll type cathode 4' whereby it is subjected to sputter etching. The treated sheet moves with the rotation of the roll and is taken up by take-up roll 11. Electric power is sent from the high frequency source 7 to pulley 14 (FIG. 5) fitted to roll electrode shaft 12 through the matching box 6, and by contact with pulley 14, the power is introduced into the rotary roll type cathode 4'. The roll electrode shaft 12 within the wall 2" of the pressure reduction vessel is ground shielded as shown at 8, and the vacuum insulation of the shaft portion is effected by an insulating pipe 15 of a fluorine resin and an O-ring 16 made of a silicone resin. The inside of the rotary roll type cathode 4' is cooled by water flown therethrough via water cooling pipe 17 to inhibit a rise in temperature due to the discharge. In FIg. 5, the straightline arrow shows the direction in which cooling water flows.

According to the present invention, a surface having excellent adhesion is obtained by sputter etching a fluorinated olefin polymer molded article in a low vacuum at room temperature in the cathode dark space while placing the molded article in contact with the cathode using an apparatus of the type described above. This is presumably due to the synergistic effect of the physical change of the surface, i.e., by fine needle-like raised and depressed portions resulting from the sputter etching, and the chemical change of the surface due to ions, electrons or ultraviolet light which result from the sputter etching.

In contrast, according to a conventional method in which a mere glow discharge treatment is performed in a positive column without causing any unevenness on the surface of the molded article, a treated surface which provides a bond strength equal to or larger than that obtainable by a chemical treatment cannot be obtained by performing the discharge treatment for a period of several seconds to tens of seconds or several minutes.

Furthermore, according to the present invention, the treated surface does not turn brown as in the case of treatment with chemicals, and the surface electric resistivity of the treated surface is substantially the same as that of the surface before treatment.

Materials useful in various applications can be provided by applying adhesive, paint, ink or various plastic materials as are used conventionally, to the treated surface obtained by this invention or bonding a metallic sheet thereto via an adhesive.

Figure 6:
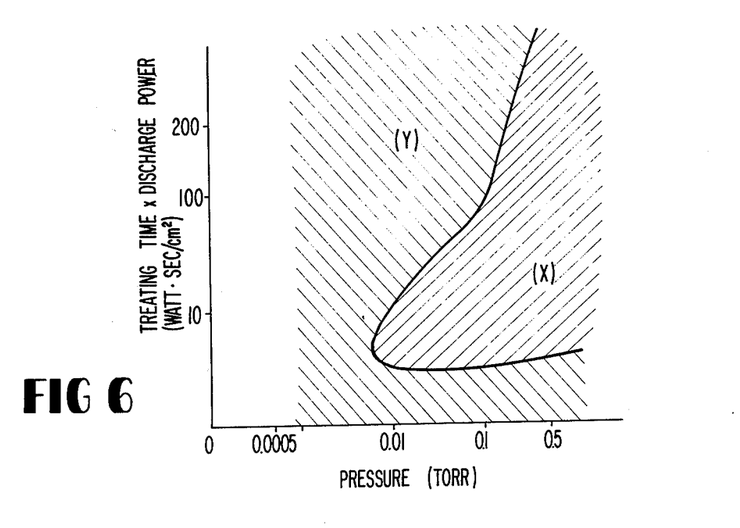
FIG. 6 is a diagram showing the relation of the treated surface of a fluorinated olefin polymer molded article to wetting with water depending upon differences in the sputter etching conditions.

The bond strength of the treated surfaces of the molded articles in accordance with this invention do not so much differ according to the type of the atmosphere used or the pressure of the atmosphere in the range of prescription at the time of treatment, but generally, the degree of wetting with water differs according to the type thereof. As shown in FIG. 6, the treated surface can be made either hydrophilic or hydrophobic by prescribing the treating time, the discharge power and the pressure of the atmosphere used as desired.

In FIG. 6, the abscissa represents the pressure of the atmosphere used at the time of treating and the ordinate the product of the treating time times the current density. In this case the atmosphere used was argon (Ar) gas. In FIG. 6, X represents the area where a hydrophilic treated surface is obtained whereas Y is the area where a hydrophobic treated surface is formed. Evaluation of wetting with water is performed by dropping about 10 cc of distilled water onto a flat portion of a test specimen by means of an injection syringe, and measuring the contact angle between the water droplet and the flat portion. When the test specimen is untreated polytetrafluoroethylene or an untreated fluoroethylene/propylene copolymer, the contact angle is 100° to 120°. Thus, an area of the treated surface which has a contact angle of at least 100° is defined as a hydrophobic area, and an area having a contact angle of less than 100° is defined as a hydrophilic area. A treated surface obtained by a conventional surface treating method using a mixture of sodium and naphthalene has a contact angle of 34° to 54°.

It has been ascertained that when steam is used as the atmosphere in the method of this invention, a treated surface having good hydrophilicity can be obtained irrespective of the treating conditions, such as the pressure of the atmospheric gas or the treating time.

The differences in the surface characteristics of molded articles according to the treating conditions can be conveniently utilized according to the desired use of the surface treated molded article.

Molded articles of fluorinated olefin polymers subjected to the sputter etching treatment by the method of this invention find various applications. For example, a pressure sensitive tape can be prepared by coating a solution of a pressure-sensitive adhesive on the treated surface of a fluorinated olefin polymer sheet and volatilizing the solvent by heat drying to thereby to form a pressure-sensitive adhesion layer, or by melt extruding the pressure-sensitive adhesive itself onto the treated surface of the sheet to form a pressure-sensitive adhesive layer. All generally known pressure-sensitive adhesives such as synthetic rubber type or silicone resin type adhesives can be used (Japanese Patent Publication (OPI) 48535/1973), but those having good thermal resistance are preferred. The pressure-sensitive tape so prepared has good anchoring between the tape base and the pressure-sensitive adhesive layer even under ultraviolet light or high temperatures, and the treated surface obtained by sputter etching does not change in color, i.e., the commercial value of the pressure-sensitive adhesive tape is not lowered. Furthermore, during the manufacture of the pressure-sensitive adhesive tape, no risk of fire exists as with conventional techniques of surface treatment using chemicals.

A composite composed of the fluorinated olefin polymer molded article and another plastic material, for example, a composite sheet, can be easily obtained by forming a plastic film layer on the treated surface of the surface-treated sheet of fluorinated polyolefin. The formation of the plastic film layer on the treated surface can be performed in any manner, e.g., by extruding a plastic melt onto the surface through a die or the like; coating a solution of a plastic onto the surface and heat drying it; or heat bonding a plastic film to the surface. The plastic film layer can also be formed by spraying a powdered plastic onto the treated surface followed by heat melting.

The material for the plastic film may, for example, include thermoplastic resins such as a polyimide (usually a polyamide acid is coated and heated to form a polyimide), a polyamideimide, a fluoroethylene propylene polymer, an ethylene/vinyl acetate copolymer or polyethylene, and thermosetting resins such as an epoxy, polyester or melamine resin. A plastic film containing a fibrous substrate, such as an epoxy prepreg, can also be used. It is also possible to bond the other plastic film to a fluorine resin sheet using the above-mentioned thermoplastic resin or thermosetting resin as an adhesive. For example, a polyimide film can be bonded to the treated surface of a fluorine resin sheet using a silicone resin adhesive.

Furthermore, a composite sheet can be produced by bonding a laminate or an inorganic insulating thermally stable base material such as thermally stable felt or non-woven glass fabric to the treated surface of the fluorine resin sheet by using the above-mentioned thermoplastic or thermosetting resins as an adhesive.

The treated surface of the sheet presents the same macroscopic visual appearance as an untreated surface without turning brown as in the case of a surface which has been treated with chemicals in accordance with conventional methods. Hence, the resulting composite sheets have superior commercial value. In addition, since the treated surface has good adhesion, the composite sheets obtained have good properties.

Furthermore, since the appearance of the treated surface is the same as that of an untreated surface, composite sheets of good aesthetic value can be obtained by applying a print or design pattern on the treated surface.

Composites, for example composite sheets, composed of the fluorinated olefin polymer molded article and a metal foil can be obtained by bonding a metallic sheet such as a copper or aluminum foil to the sputter etched surface of the molded article using an adhesive made of a synthetic resin such as an epoxy resin, a polyimide, a butyral resin, a phenolic resin or a polyamideimide.

When a polytetrafluoroethylene sheet is used as the fluorinated olefin polymer sheet, such a metallic sheet can be bonded to the treated surface of the sheet using a fluorine resin type adhesive such as a fluoroethylene propylene polymer or hexafluoropropylene polymer to form a composite sheet.

Alternatively, a metal-clad sheet can be obtained by directly vacuum depositing a metal onto the sputter etched surface of the fluorinated olefin polymer sheet without an intermediate adhesive layer.

Also, a display of ink or paint, etc., can be formed on the sputter etched surface of the fluorine resin molded article obtained by the present invention. Since the treated surface has superior adhesion capability as a result of sputter etching, the adhesion between the display and the molded article is superior, and, moreover, the mechanical and electrical characteristics of the molded article are not impaired by the sputter etching treatment.

When an aqueous medium-containing material such as a water-soluble adhesive, a pressure-sensitive adhesive of the aqueous emulsion type, or a paint of the aqueous suspension type is to be coated on the treated surface of the sputter etched molded article in the production of a pressure-sensitive adhesive tape, a composite sheet, a display material, etc., using a surface treated molded article, the sputter etching treatment is carried out under such conditions that the resulting treated surface becomes hydrophilic.

The following Examples and Comparative Examples illustrate the present invention more specifically.

Unless otherwise indicated the molecular weight of fluorinated polymers or copolymers used was from about $2 \times 10^4$ to about $1 \times 10^7$.

EXAMPLE 1

A 0.2 mm thick polytetrafluoroethylene (to be referred to as PTFE hereafter) sheet was placed in an apparatus of the type shown in FIG. 1 (the distance between the electrodes was 110 mm). The inside of the pressure reduction chamber was adjusted to a pressure of less than $1 \times 10^{-5}$ Torr by means of a vacuum pump. Argon was introduced via conduit 3(a) and valve 3 to maintain the pressure of the argon atmosphere at $5 \times 10^{-3}$ Torr. A high frequency voltage of 13.56 MHz was applied, and the sheet was subjected to sputter etching for 30 seconds while keeping the discharge power at 4.0 Watt/cm². The control of the pressure of the atmosphere was carried out by controlling a valve (not shown) in the exhaust pipe 1 while introducing argon at a rate of 20 cc/min. from conduit 3(a). The power was then cut off, and air was let in from conduit 3(a) to return the pressure inside the pressure reduction chamber to atmospheric pressure. Thus, one surface of the PTFE sheet was treated. In a second sample the other untreated surface of the sheet was also splutter etched in the same way as above to form a sheet both surfaces of which were treated.

Figure 7:
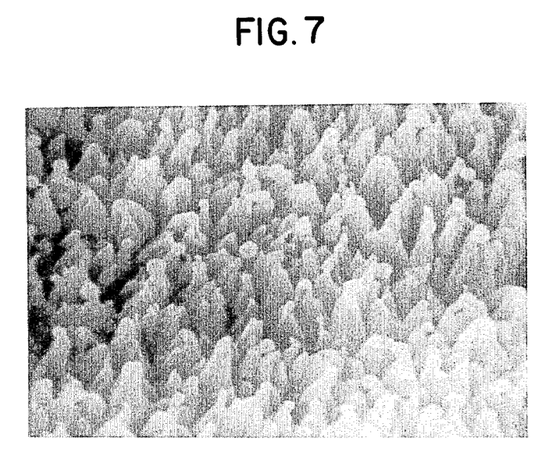

The surface condition of the treated sheet is shown in the photograph of FIG. 7. The appearance of the treated surface, when visually observed, did not show any difference from an untreated surface.

A pressure-sensitive adhesive tape (No. 31, a product of Nitto Electric Industrial Co., Ltd.) using polyethylene terephthalate as a support and a polyacrylate adhesive was bonded to the treated surface of the one surface treated sheet obtained above. A manually operated rubber roller was urged against the bonded tape and reciprocated 5 times (bond area 75 mm × 19 mm), and a 180° peeling test was performed at a speed of 300 mm/min. The peel strength was found to be 1560 g.

Figure 8:
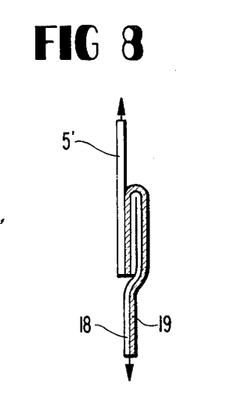
FIGS. 8 and 10 are schematic views illustrating the 180° peeling test.

The 180° peeling test was performed by means of a tensile tester (Tensilon UTM-4-100, a product of Toyo Baldwin Co., Ltd.) by pulling a specimen of the type as shown in FIG. 8. In FIG. 8, reference numeral 5' represents the one surface treated sheet; 18 the polyethylene terephthalate support; and 19 the pressure-sensitive adhesive layer formed on the polyethylene terephthalate support.

The same peeling test was performed using a PTFE sheet before treatment and a PTFE sheet treated with a mixture of sodium naphthalene by a conventional method. The peel strengths were 78 g and 740 g, respectively.

The two treated sheets obtained as above and a PTFE sheet treated on both surfaces with a mixture of sodium and naphthalene by a conventional method were placed 25 cm immediately below a 1 KW mercury lamp (50 mm diameter, 300 mm length), and irradiated for about 8 hours (hereafter, UV irradiation was performed at these conditions under otherwise indicated). The shear bond strengths of the resulting specimens were measured, and the results are shown in Table 1. The shear bond strength of each of the specimens before irradiation is also shown.

Table 1

| Samples | Before irradiation (Kg/cm$^2$) | After irradiation for 8 hours (Kg/cm$^2$) |
|---|---|---|
| Treated sheet obtained in this Example | 230 | 224 |
| PTFE sheet treated with a mixture of sodium and naphthalene | 195 | 34 |

The shear bond strength was measured in the following manner.

Figure 9:
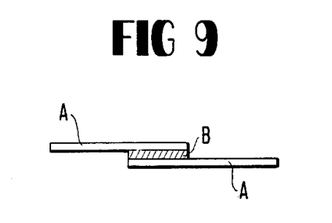
FIG. 9 is a schematic view illustrating measuring shear bond strength.

The specimen was cut to a size of 40 mm × 10 mm, and both surfaces of the test piece obtained were coated with an epoxy resin adhesive consisting of a mixture of 55% by weight of epoxy resin and 45% by weight of polyamide resin (Bond E Set Clear, trademark for a product of Konishi Gisuke Shoten K.K.). The coated test piece was interposed in sandwich form between two flat surface steel sheets as shown in FIG. 9, and heat cured for 60 minutes at a pressure of 100 g/cm$^2$ and a temperature of 70° C to form a specimen for measuring shear bond strength. In FIG. 9, (A) represents a flat surface steel sheet and (B) represents the test piece coated with the adhesive. The resulting specimen was pulled at a rate of 1.5 mm/min using a tensile tester (Tensilon UTM-4-100, a product of Toyo Baldwin Co., Ltd.), and the shear bond strength was measured.

When the two surface treated sheet obtained in this Example and a PTFE sheet (both surfaces of which had been treated with a mixture of sodium and naphthalene) were each allowed to stand for 5 days in a warm bath (180° C), and subjected to the same shear bond strength test as above, they exhibited a shear bond strength of 212 Kg/cm$^2$, and 83 Kg/cm$^2$, respectively.

The surface resistivity, measured in accordance with JIS K-6911, of the one surface treated sheet obtained in this Example is shown in Table 2. The surface resistivity values of an untreated PTFE sheet and a PTFE sheet treated with a mixture of sodium and naphthalene are also shown.

Table 2

| | Conditions of the atmosphere in which measurement was made | |
|---|---|---|
| | 23° C, 40% RH (ohms) | 23° C, 60% RH (ohms) |
| Treated sheet of this Example | 2 × 10$^{16}$ | 5 × 10$^{15}$ |
| untreated PTFE sheet | 3 × 10$^{16}$ | 8 × 10$^{15}$ |
| PTFE sheet treated with a mixture of sodium and naphthalene | 2 × 10$^{16}$ | 6 × 10$^{12}$ |

When one-surface treated sheets of PTFE were prepared in the same way as above except using air, N$_2$, CO$_2$, and O$_2$, respectively, as the atmospheric gas at a pressure of 5 × 10$^{-3}$ Torr, and subjected to the same 180° peeling test, they exhibited peel strengths of 1450 g, 1510 g, 1380 g, and 1530 g, respectively, showing no particularly significant difference.

Furthermore, when one surface treated sheets of PTFE were prepared in the same way as above in an atmosphere of argon except that the pressure of the atmosphere was changed to 1 × 10$^{-3}$, 1 × 10$^{-2}$, 2 × 10$^{-2}$, 5 × 10$^{-2}$, and 1 × 10$^{-1}$ Torr, and subjected to the same 180° peeling test, then they exhibited peel strengths of 1520 g, 1490 g, 1570 g, 1390 g, and 1460 g respectively, showing no remarkable differences.

EXAMPLES 2 to 18

One surface treated sheets and two-surface treated sheets were prepared in the same way as in Example 1 under the conditions shown in Table 3.

Table 3

| Example | Sheet Type | Thickness (mm) | Atmosphere Type | Atmosphere Pressure (Torr) | Discharge power (W/cm$^2$) | Distance between electrodes (mm) | Treating time (seconds) |
|---|---|---|---|---|---|---|---|
| 2 | PTFE | 0.2 | Air | 5 × 10$^{-2}$ | 0.5 | 110 | 4 |
| 3 | PTFE | 0.2 | Air | 5 × 10$^{-2}$ | 0.5 | 110 | 8 |
| 4 | PTFE | 0.2 | Air | 5 × 10$^{-2}$ | 0.5 | 110 | 15 |
| 5 | PTFE | 0.1 | Air | 5 × 10$^{-2}$ | 2 | 110 | 15 |
| 6 | PTFE | 0.1 | Air | 5 × 10$^{-2}$ | 2 | 110 | 30 |
| 7 | PTFE | 0.1 | Air | 5 × 10$^{-2}$ | 2 | 110 | 60 |
| 8 | PTFE | 0.1 | Air | 1 × 10$^{-1}$ | 0.25 | 110 | 30 |
| 9 | PTFE | 0.1 | Air | 1 × 10$^{-1}$ | 0.5 | 110 | 30 |
| 10 | PTFE | 0.1 | Air | 1 × 10$^{-1}$ | 1 | 110 | 30 |
| 11 | PTFE | 0.1 | Air | 1 × 10$^{-1}$ | 2 | 110 | 30 |

Table 3-continued

| Example | Sheet Type | Thickness (mm) | Atmosphere Type | Atmosphere Pressure (Torr) | Discharge power (W/cm²) | Distance between electrodes (mm) | Treating time (seconds) |
|---|---|---|---|---|---|---|---|
| 12 | PTFE | 0.1 | Argon | $5 \times 10^{-3}$ | 0.25 | 40 | 30 |
| 13 | PTFE | 0.1 | Argon | $5 \times 10^{-3}$ | 0.25 | 110 | 30 |
| 14 | *PTFE with MoS₂ | 2.0 | Air | $1 \times 10^{-2}$ | 2 | 110 | 30 |
| 15 | **PTFE with graphite | 2.0 | Air | $1 \times 10^{-2}$ | 2 | 110 | 30 |
| 16 | ***PTFE with bronze powder | 2.0 | Air | $1 \times 10^{-2}$ | 2 | 110 | 30 |
| 17 | PTFE | 0.05 | Air | $1 \times 10^{-2}$ | 2 | 110 | 30 |
| 18 | FEP | 0.12 | Air | $1 \times 10^{-2}$ | 2 | 110 | 10 |

*MoS₂ 20 parts by weight per 100 parts by weight of PTFE added
**graphite 20 parts by weight per 100 parts by weight of PTFE added
***bronze powder 20 parts by weight per 100 parts by weight of PTFE added Of the sheets used in the above Examples, those in Examples 2 to 13 were cut sheets, and the sheet used in Example 17 was prepared by adding a lubricant (carnation oil) to PTFE powder (in an amount of 33 cc per 100 g PTFE, stretching the mixture to form a tape, and calcining the resulting tape (Nitrofuron No. 920, a trademark for a product of Nitto Electric Industrial Co., Ltd.).

The sheets used in Examples 14, 15 and 16 were Nitofuron No. 944M, No. 944G, and No. 944B, respectively. FEP in Table 3 stands for a fluoroethylene propylene polymer (melt viscosity at 380° C: about 10⁴ to about 10⁶ poise).

The properties of the surface treated sheets obtained in Examples 2 to 18 were measured in the same way as in Example 1, and the results are shown in Table 4 below.

Table 4

| | | Shear bond strength (Kg/cm²) | | | |
|---|---|---|---|---|---|
| Ex. | 180° peeling test (g/19mm width) | Immediately after surface treatment | After irradiation by a mercury lamp | After standing for 5 days at 180° C | Appearance of the treated surface (visual observation) |
| 2 | 890 | 62 | 60 | 58 | Equivalent to the non-treated article |
| 3 | 1050 | 68 | 67 | 65 | " |
| 4 | 1210 | 75 | 73 | 72 | " |
| 5 | 1360 | 105 | 102 | 98 | " |
| 6 | 1280 | 172 | 165 | 160 | " |
| 7 | 1330 | 201 | 193 | 195 | " |
| 8 | 1250 | 65 | 63 | 61 | " |
| 9 | 1310 | 88 | 85 | 82 | " |
| 10 | 1350 | 110 | 105 | 104 | " |
| 11 | 1290 | 175 | 169 | 165 | " |
| 12 | 1330 | 95 | 93 | 90 | " |
| 13 | 1280 | 90 | 88 | 87 | " |
| 14 | 1480 | 195 | 180 | 177 | " |
| 15 | 1450 | 205 | 195 | 190 | " |
| 16 | 1500 | 210 | 199 | 193 | " |
| 17 | 1350 | 162 | 160 | 154 | " |
| 18 | above 1670 | 170 | 160 | 155 | " |

When the treated sheet obtained in Example 18 was subjected to the 180° peeling test, the adhesive of the adhesive tape used was transferred to the surface treated.

EXAMPLE 19

A long strip of PTFE sheet with a thickness of 0.2 mm and a width of 150 mm was placed in an apparatus of the type shown in FIG. 4 (the distance between the electrodes was 40 mm), and the interior of the pressure reduction chamber was adjusted to a pressure of $1 \times 10^{-3}$ Torr by means of a vacuum pump.

The take-up roll 11 was driven, and while moving and taking up the PTFE sheet strip, a high frequency voltage of 13.56 MHz was applied to it to perform sputter etching. The discharge power and the treating time were changed as shown in Table 5.

The pressure of the atmosphere was adjusted to $5 \times 10^{-3}$ Torr using the valve (not shown) in the exhaust pipe 1 while introducing the atmosphere at a rate of 20 cc/min from conduit 3. (This method of pressure adjustment is indicated by X in Table 5 under the heading "State of the atmosphere".)

Alternately, the pressure of the atmosphere before the sputter etching was adjusted to $5 \times 10^{-3}$ Torr and only the valve of the exhaust pipe was controlled while closing the valve 3, to thereby maintain the pressure of the atmosphere at $5 \times 10^{-3}$ Torr. The sputter etching was then carried out at this pressure. (This method of pressure adjustment is indicated by Y in Table 5 under the heading "State of the atmosphere".) In this case, the sputter etching was performed in the presence of the gas resulting from the decomposition of the PTFE by the discharge.

Figure 10:
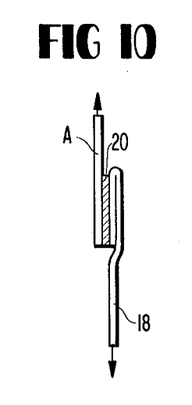

Each of the surface treated PTFE sheets was subjected to the 180° peeling test using an epoxy resin adhesive in accordance with JIS K-6854 as follows:

Each of the treated sheets was cut to a size of 125 mm in length and 25 mm in width. The cut, treated sheet was bonded over a length of 75 mm to a flat steel sheet on which an epoxy resin-type adhesive (Bond E Setclear, trademark for a product of Konishi Gisuke Shoten K. K.) had been coated. The sheet was pressed by reciprocating a manually operated rubber roller five times, and the assembly was heated for 45 minutes at 85° C and 250 g/cm² to cure the adhesive. The resulting specimen was allowed to stand in air held at a relative humidity of 60 ± 5% for 3 hours, and pulled in the direction of the arrow as shown in FIG. 10. The peel strength was therefore obtained.

In FIG. 10, (A) represents a flat-surface steel sheet; 18 the treated sheet; and 20 a cured product of the epoxy resin type adhesive.

The tensile tester used was Tensilon UTM-4-100, a product of Toyo Baldwin Co., Ltd.

Table 5

| Sample No. | Driving speed of take-up roll (cm/min) | Discharge power (W/cm²) | Treating time (sec.) | State of the atmosphere | 180° peeling test (Kg/cm²) |
| --- | --- | --- | --- | --- | --- |
| 1 | 39 | 2 | 20 | X | 0.77 |
| 1' | 39 | 2 | 20 | Y | 0.85 |
| 2 | 16 | 2 | 50 | X | 1.05 |
| 2' | 16 | 2 | 50 | Y | 1.04 |
| 3 | 6 | 2 | 125 | X | 1.24 |
| 3' | 6 | 2 | 125 | Y | 1.24 |
| 4 | 3 | 2 | 250 | X | 1.53 |
| 4' | 3 | 2 | 250 | Y | 1.37 |
| 5 | 60 | 3 | 13 | X | 0.79 |
| 5' | 60 | 3 | 13 | Y | 0.83 |
| 6 | 24 | 3 | 33 | X | 1.18 |
| 6' | 24 | 3 | 33 | Y | 1.23 |
| 7 | 9 | 3 | 83 | X | 1.50 |
| 7' | 9 | 3 | 83 | Y | 2.00 |
| 8 | 5 | 3 | 167 | X | 1.46 |
| 8' | 5 | 3 | 167 | Y | 1.77 |
| 9 | 78 | 4 | 10 | X | 0.85 |
| 9' | 78 | 4 | 10 | Y | 0.83 |
| 10 | 30 | 4 | 25 | X | 1.17 |
| 10' | 30 | 4 | 25 | Y | 1.00 |
| 11 | 12 | 4 | 63 | X | 1.42 |
| 11' | 12 | 4 | 63 | Y | 1.37 |
| 12 | 6 | 4 | 125 | X | 1.39 |
| 12' | 6 | 4 | 125 | Y | 1.29 |

It was observed that any fracturing of the sample by the pulling force in the 180° peeling test always occurred at the interface between the cured product 20 of the epoxy resin type adhesive and the treated sheet.

The treated surface of the treated sheet obtained from Sample No. 3 of this Example is shown in FIG. 11.

On the other hand, a 0.2 mm thick PTFE sheet was surface treated with a mixture of sodium and naphthalene by an ordinary commercial process, and subjected to the same 180° peeling test as above using the same epoxy resin type adhesive. The peel strength of this treated sheet was found to be 0.9 Kg/cm².

Samples of sodium/naphthalene-treated PTFE sheets and surface treated PTFE sheets obtained as for Sample No. 6 above were placed 25 cm immediately below a 1 KW mercury lamp (with a diameter of 50 mm and a length of 300 mm), and irradiated for 4 and 8 hours, respectively. The resulting specimens were subjected to the same 180° peeling test as described above using the same epoxy resin type adhesive. The results are shown in Table 6.

Table 6

| Specimen | After irradiation for 4 hours (Kg/cm²) | After irradiation for 8 hours (Kg/cm²) |
| --- | --- | --- |
| Surface treated PTFE sheets obtained as in Sample No. 6 | 1.17 | 1.16 |
| Sodium/naphthalene treated PTFE sheets | 0.33 | 0.23 |

The discharge treatments were conducted in Examples 1 to 19 under the same conditions except that the frequency used was 20 KHz. The treated surface in each case exhibited substantially the same adhesive strength as those obtained by a conventional glow discharge treatment and peculiar papillar projections as shown in FIGS. 7 and 11 were not formed.

On the other hand, sputter etching treatments of a fluorinated α-olefin polymer article wherein the same conditions as in Examples 1 to 19 were used except that the frequency was set at 27.12 MHz provided products having substantially the same quality as those obtained in Example 1 to 19.

COMPARATIVE EXAMPLE 1

Figure 12:
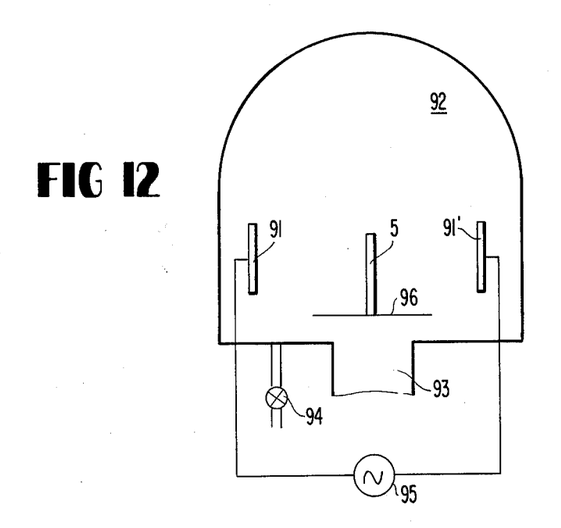
FIG. 12 is a schematic view of one example of an apparatus used for a general glow discharge treatment.

The same sheet as was used in Example 7 was subjected to a glow discharge using an apparatus of the type shown in FIG. 12.

The sheet 5 was set at about the center between electrodes 91 and 91' (the distance between the electrodes was 160 cm), and the pressure of the interior of the pressure reduction chamber 92 was reduced to 0.01 Torr by means of a vacuum pump. The discharge treatment was then carried out for 30 seconds at a discharge voltage of 7 KV, a frequency of 60 Hz, and a discharge current of 20 mA to obtain a both surface treated sheet.

In FIG. 12, the reference numeral 93 represents an exhaust pipe connected to a vacuum pump (not shown) for evacuating the gas within the pressure reduction chamber 92; and 94 represents a leak valve for returning the pressure of the interior of the pressure reduction chamber 92 to atmospheric pressure.

Electrodes 91 and 91' for the glow discharge were connected to an exterior alternate current source 95 by means of a electrically insulated and air-tight lead wire as shown. Reference numeral 96 represents a support stand for the sheet.

The properties of the sheet obtained in this Comparative Example were measured in the same was as in Example 1. The results were as follows:

When a pressure-sensitive adhesive tape having polyethylene terephthalate as a base (No. 31 made by Nitto Denko K. K.) was used in the 180° peeling test, the sheet had a peel strength of 550 g and a shear bond strength of: 25 Kg/cm² as treated, 21 Kg/cm² after irradiation from a mercury lamp and 23 Kg/cm² after standing in air for 5 days at 180° C.

Figure 13:
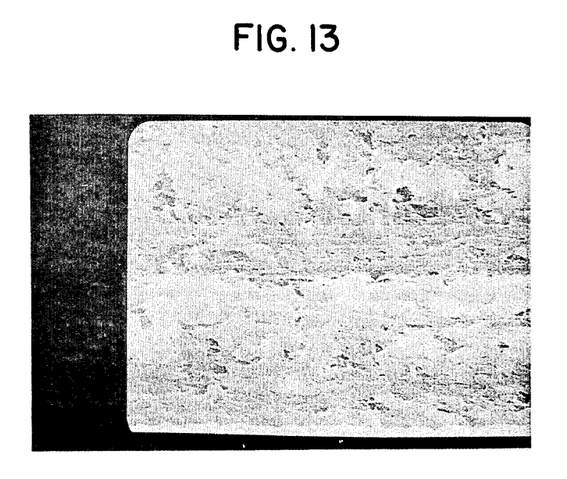
FIGS. 13 and 14 are photographs on a scale of 4000 X which show the surface condition of a fluorinated olefin polymer sheet subjected to a general glow discharge treatment.

The treated surface is shown in FIG. 13.

COMPARATIVE EXAMPLE 2

The same sheets as were used in Example 3 were positioned in such a condition that they would not be sputter etched, and were subjected to a glow discharge treatment to form a one-surface treated sheet and a two-surface treated sheet.

Specifically, the PTFE sheet was set at the center of electrode 4 in FIG. 1 so that the sheet was perpendicular to the surface of the electrode. In this state, the sheet was subjected to discharge under the same conditions as in Example 3. The properties of the treated sheet were measured in the same way as in Example 1. When a pressure-sensitive adhesive tape (No. 31 made by Nitto Denko K. K.) was used, the treated sheet exhibited a peel strength, in the 180° peeling test, of 380 g, and a shear bond strength of: 25 Kg/cm² as treated, 24 Kg/cm² after irradiation from a mercury lamp, and 22 Kg/cm² after standing for 5 days at 180° C.

Figure 14:
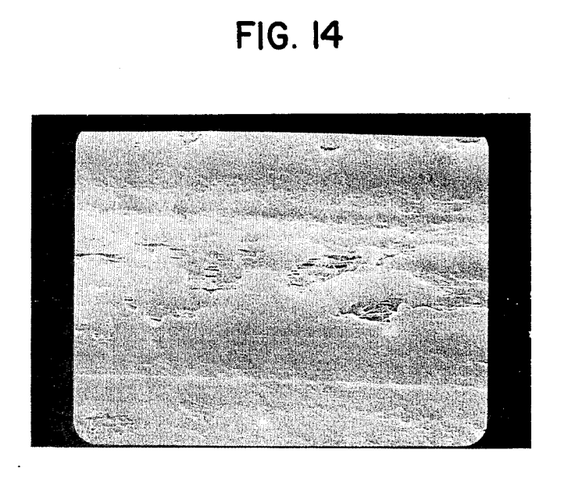

The condition of the treated surface is shown in FIG. 14.

APPLICATION EXAMPLE 1

A solution consisting of 50 parts by weight of a mixture of dimethyl silicone (KR-101-10, trademark for a product of Shinetsu Chemical Co., Ltd.) and 2% by weight of benzoyl peroxide and 117 parts by weight of toluene was coated on the treated surface of the one surface treated sheet obtained in Example 3, and dried at 120° C for 5 minutes and subsequently at 200° C for 5 minutes to obtain a pressure-sensitive adhesive tape having a pressure-sensitive adhesive layer of a thickness of 10 microns.

The pressure-sensitive adhesive tape obtained was cut into a size of 19 mm in width and 120 mm in length, and bonded to a stainless steel sheet having a width of 30 mm and a length of 200 mm. The resulting composite was subjected to the 180° peeling test using a tensile tester (Tensilon UTM4-100, a product of Toyo Baldwin Co., Ltd.) at a pulling speed of 300 mm/min. The peel strength was found to be 415 g.

Furthermore, the above pressure-sensitive adhesive solution was coated on another sample of one surface treated sheet obtained by the above described method, and dried at 120° C for 5 minutes and subsequently at 200° C for 5 minutes to form a pressure-sensitive adhesive type having a pressure-sensitive adhesive layer with a thickness of 5 microns.

The resulting pressure-sensitive adhesive tape was cut into two pieces each having a width of 19 mm and a length of 120 mm. The two pieces were bonded to each other so that the adhesive layers abutted against each other to make a specimen for the measurement of anchoring strength.

Figure 15:
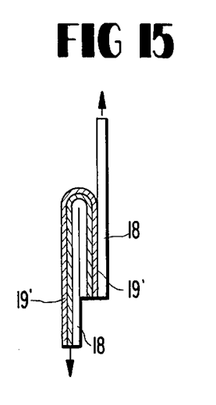
FIG. 15 is a schematic view illustrating measuring the anchoring strength of a pressure sensitive adhesive tape.

The specimen was peeled from its end on the widthwise side in the state shown in FIG. 15, and subjected to the 180° peeling test at a pulling speed of 300 mm/min. Its anchoring strength was found to be 550 g.

In FIG. 15, reference numeral 18 represents the PTFE sheet, and 19' the pressure-sensitive adhesive layer. The arrow shows the pulling direction.

The same test was performed with regard to a pressure-sensitive adhesive tape prepared in the same way as in this Application Example 1 except that the PTFE sheet had been treated with a mixture of sodium and naphthalene. Its anchoring strength was found to be 490 g.

The pressure-sensitive adhesive tape with a 10 micron-thick adhesive layer obtained above, 19 mm wide and 120 mm long, was bonded to a stainless steel sheet having a width of 30 mm and a length of 200 mm, and the composite was put in a bath for a weathering test (Weather Meter WE-T-2NHC, a product of Toyo Rika Kogyo Co., Ltd.; Power Source: 180-220 V, Capacity: 9 KVA, Frequency: 60 Hz) and taken out 124 hours later. When the composite was peeled apart into the constituent sheets at a pulling speed of 300 mm/min and an angle of 180°, the pressure-sensitive adhesive layer did not separate from the surface of the PTFE sheet.

When the same peeling test was performed with regard to a pressure-sensitive adhesive tape with a 10 micron-thick adhesive layer obtained in the same way as above using a PTFE sheet whose surface had been treated with a mixture of sodium and naphthalene, the pressure-sensitive adhesive layer was partly peeled off from the surface of the PTFE sheet.

APPLICATION EXAMPLES 2 TO 14

One surface treated sheets were prepared in the same way as in Example 1, and the same pressure-sensitive adhesive solution as was used in Application Example 1 was coated on the surface treated sheets and dried under the same conditions as in Application Example 1 to form pressure-sensitive adhesive tapes. The conditions employed are shown in Table 7.

Table 7

| Application Ex. | Sheet Kind | Thickness (mm) | Atmosphere gas Kind | Pressure (Torr) | Discharge power (W/cm²) | Treating time (sec.) |
|---|---|---|---|---|---|---|
| 2 | PTFE | 0.05 | Air | $1 \times 10^{-2}$ | 2.0 | 1 |
| 3 | " | " | " | " | " | 2 |
| 4 | " | " | " | " | " | 3 |
| 5 | " | " | Nitrogen | " | " | 4 |
| 6 | " | 0.1 | " | $2 \times 10^{-2}$ | 0.5 | 4 |
| 7 | " | " | Argon | $5 \times 10^{-3}$ | 0.5 | 30 |
| 8 | " | " | " | " | 2.0 | 4 |
| 9 | " | " | $CO_2$ | " | 4.0 | 4 |
| 10 | " | " | " | $5 \times 10^{-3}$ | 2.0 | 2 |
| 11 | FEP | 0.12 | Air | $1 \times 10^{-2}$ | 0.5 | 15 |
| 12 | FEP | " | Nitrogen | " | " | 30 |
| 13 | PTFE with glass cloth | 0.15 | Air | " | 2.0 | 2 |
| 14 | " | " | " | " | " | 4 |

In Application Examples 2 to 14, the distance between the electrodes was 110 mm in all cases.

Of the sheets shown in Table 7, those in Application Examples 2 to 9 were cut sheets; that used in Application Example 10 was prepared by adding a lubricant (carnation oil) to PTFE powder in an amount of 33 cc per 100 g of PTFE, roll stretching the resulting mixture, and calcining the tape obtained (Nitofuron No. 920, trademark for a product of Nitto Electric Industrial Co., Ltd.) in the same manner as in the preceding Examples; and those used in Application Examples 13 and 14 were Nitofuron No. 97 (a product of Nitto Electric Industrial Co., Ltd.) prepared by impregnating a glass cloth with an aqueous dispersion containing 60 wt% of polytetrafluoroethylene, and heat drying it by passing it through a heated oven having a length of 2 m at a rate of 1 m/min at 370° C. The amount of PTFE adhered on the sheet was 50 wt%.

FEP in Table 7 stands for a fluoroethylene/propylene copolymer (tetrafluoromethylene: hexafluoropropylene = 75 wt%: 25 wt%; melt viscosity: about $10^4$ to about $10^6$ poise).

The properties of the pressure-sensitive adhesive tapes shown in Table 7 were measured, and the results are shown in Table 8.

By visual observation, the appearance of each of the surface treated sheets shown in Table 8 was not different from that of the untreated sheet.

Table 8

| Application Example | Peel strength to stainless steel (g) | Anchoring strength (g) Initial value | After standing for 14 days at 50° C and 95% RH | After standing in weatherometer for 124 hours |
|---|---|---|---|---|
| 2 | 410 | 430 | 435 | 400 |
| 3 | 405 | 505 | 510 | 480 |
| 4 | 415 | 520 | 500 | 490 |
| 5 | 410 | 520 | 510 | 460 |
| 6 | 420 | 440 | 425 | 390 |
| 7 | 420 | 550 | 540 | 505 |
| 8 | 405 | 540 | 545 | 530 |
| 9 | 410 | 560 | 560 | 525 |
| 10 | 405 | 545 | 550 | 515 |
| 11 | 410 | 760 | 760 | 735 |
| 12 | 415 | 810 | 820 | 790 |
| 13 | 405 | 510 | 475 | 450 |
| 14 | 410 | 880 | 870 | 825 |

The adhesion to the stainless steel sheet and the anchoring strength shown in Table 8 were measured in the same way as in Application Example 1.

APPLICATION EXAMPLE 15

A 0.1 mm cut PTFE tape was set in an apparatus of the type shown in FIG. 1. The pressure of the interior of the pressure reduction chamber was reduced to less than $1 \times 10^{-5}$ Torr. Then, steam was introduced and its pressure was maintained at 0.01 Torr. The sheet was subjected to sputter etching for 30 seconds while maintaining the distance between the electrodes at 110 mm and using a discharge power of 0.5 Watt/cm$^2$. The adjustment of the pressure of the atmosphere was performed by controlling a valve (not shown) in exhaust pipe 1 while introducing the steam from conduit 3(a) at a rate of 20 cc/min.

An emulsion type pressure-sensitive adhesive consisting of 50 parts by weight of a mixture of dimethyl silicone (KR-101-10, a trademark for a product of Shinetsu Chemical Co., Ltd.) and 2% by weight of benzoyl peroxide, 3 parts by weight of a nonionic emulsifier (polyethylene glycol monononylphenyl ether) and 50 parts by weight of water was coated to a thickness of 10 microns on the treated surface of the resulting one surface treated sheet. It was then dried at 120° C for 5 minutes and subsequently at 200° C for 5 minutes to obtain a pressure-sensitive adhesive tape free of voids made by the repelling of the adhesive composition from the treated surface.

The resulting pressure-sensitive adhesive tape was press bonded to a degreased steel sheet by reciprocating a roll weighing 5 Kg thereover, and, after bonding, the composite was allowed to stand at 20° C for 2 hours in the air. Then, the composite was peeled apart at a pulling speed of 300 mm/min into the constituent sheets; the pressure-sensitive adhesive layer did not separate from the PTFE base.

The degreased steel plate used above had been prepared by sanding a steel sheet with 400-mesh sand paper and then immersing it in acetone at room temperature for 6 hours.

When the same pressure-sensitive adhesive emulsion as used above was applied to a PTFE sheet whose surface had been treated with a mixture of sodium and naphthalene, the surface mostly repelled the emulsion, and uniform coating could not be performed.

COMPARATIVE APPLICATION EXAMPLE

The same pressure-sensitive adhesive solution as was used in Application Example 1 was coated on the treated surface of the same surface treated PTFE sheet as was obtained in Comparative Example 2, and then heat dried to form a pressure-sensitive adhesive tape in the same manner as in Application Example 1.

The resulting pressure-sensitive adhesive tape had a bond strength, with respect to a stainless steel sheet, of 350 g. When the tape was peeled off from the stainless steel sheet, the adhesive layer partly separated from the tape base. Furthermore, the adhesive tape had an anchoring strength of: 385 g in the initial stage, 340 g after standing for 14 days in a weatherometer, and 370 g after standing for 14 days in air at a temperature of 50° C and a relative humidity of 95%.

APPLICATION EXAMPLE 16

A fluoroethylene/propylene copolymer (tetrafluoroethylene: hexafluoropropylene = 75 wt%: 25 wt%; melt viscosity: about 10$^4$ to about 10$^6$) was melted at 280° C and coated on the treated surface of the one surface treated PTFE sheet obtained in Example 6, and the sheet was gradually cooled by being passed between rolls (with a roll clearance of 0.5 mm) to form a composite sheet. The resulting composite sheet was bondable to other materials by the melt adhering action of the fluoroethylene propylene polymer, and is useful as a lining material of a tank for chemicals which requires good chemical resistance.

APPLICATION EXAMPLE 17

A silicone resin-type adhesive (Silastick 732 RTV, trademark for a product of Shinetsu Chemical Co., Ltd.) was coated on the treated surface of a one surface treated sheet of PTFE obtained as in Example 5, and a polyimide film (Kapton, trademark for a product of Du Pont) having coated thereon the same adhesive was placed on the adhesive coated surface of the PTFE sheet, and the assembly bonded at 50° C under a pressure of 259 g/cm$^2$ for 6 hours. The resulting composite is useful as a panel heater for high temperature use.

APPLICATION EXAMPLE 18

An epoxy resin adhesive (Bond E Setclear, trademark for a product of Konishi Gisuke Shoten K.K.) was coated on the treated surface of a one surface treated PTFE sheet obtained from Sample No. 2' in Example 19, and a 1 mm thick stainless steel sheet was superimposed thereon. The assembly was bonded for 60 minutes at 70° C and 100 g/cm$^2$ to form a composite sheet.

The resulting composite sheet is useful as a corrosion resistance increased stainless steel sheet. Furthermore, this composite can be cold drawn.

APPLICATION EXAMPLE 19

A copper foil having a thickness of 0.035 mm was bonded to the treated surface of a one surface treated PTFE sheet obtained as in Example 2 using an adhesive prepared by uniformly dissolving 100 parts of an epoxy resin (Epon 828, trademark for a product of Shell Chemical Co.), 200 parts by weight of a polyvinyl butyral resin (Denko Butyral 3000-2, a trademark for a product of Denki Kagaku Kogyo K.K.), and 75 parts by weight of maleic anhydride as a curing agent in a mixture of acetone and benzene (1:1 V/V). The assembly was bonded for 45 minutes at 160° C and 20 Kg/cm$^2$ to form a printed circuit board. When the resulting board was subjected to the 180° peeling test in accordance with the method set forth in IPC-FC-240, it was found to have a peel strength of 1.2 Kg. It has satisfactory solder heat resistance for use as a printed circuit board, and can provide a printed circuit having superior high frequency characteristics.

APPLICATION EXAMPLE 20

A stainless steel sheet having a thickness of 0.7 mm was bonded to the treated surface of a one surface treated FEP sheet obtained as in Example 18 using an epoxy resin type adhesive (Bond E Setclear, a trademark for a product of Konishi Gisuke Shoten K.K.) to obtain a composite sheet.

This composite sheet is useful for various applications such as an anticorrosive lining material.

APPLICATION EXAMPLE 21

A pressure-sensitive adhesive sheet obtained in the same way as in Application Example 15 was bonded to a metallic sheet such as an aluminum or stainless steel sheet to form a composite sheet.

The resulting composite sheet is useful, for example, as an electrical component part, or anticorrosive, protective, lubricating or decorative materials.

APPLICATION EXAMPLE 22

Copper was vacuum deposited for 20 minutes on the treated surface of a one surface treated PTFE sheet obtained from Sample No. 5 in Example 19 under the following conditions.

Pressure of the atmosphere: $6 \times 10^{-5}$ Torr
Copper heating temperature: 150° C
Vacuum deposition speed: 50 A/min.

A composite sheet having about a 1000 A thick copper vacuum deposited layer thereon was obtained.

The resulting composite sheet was subjected to electroless copper plating to form a 1.5 micron thick plated layer. Then, it was subjected to electrolytic copper sulfate plating for 3 hours while maintaining the current density at 2 amperes/cm$^2$ to obtain a laminate having a copper layer of a thickness of 50 microns. The resulting laminate had superior adhesion, fold resistance, etching bath resistance and solder heat resistance, and could be utilized as a printed circuit board.

On the other hand, a copper laminate was prepared using a PTFE sheet not subjected to the sputter etching treatment, but it was found that the resulting laminate had very low adhesion, and could not be utilized as a printed circuit board.

While the invention has been described in detail and with reference to specific embodiments thereof, it will be apparent to one skilled in the art that various changes and modifications can be made therein without departing from the spirit and scope thereof.

What is claimed is:

1. A process for surface treating a molded article, which comprises subjecting a molded article of a fluorinated olefin polymer to sputter etching by bringing the fluorinated olefin polymer into contact with a cathode in a chamber internally equipped with an anode and the cathode with the minimum distance between the anode and the cathode being substantially $1/\sqrt{P}$, wherein P is the pressure in Torr, said chamber being capable of being evacuated to provide a vacuum therein, and in this state applying a high frequency of several hundred KHz to several ten MHz alternating current between the anode and the cathode while maintaining the pressure and temperature of the gaseous atmosphere in the chamber at about 0.0005 to about 0.5 Torr and about $-10°$ C to about 40° C, with the product of the discharge power for the sputter etching and the treating time being about 1 to about 1,000 watt. sec/cm$^2$, to thereby sputter etch the molded article in the resulting cathode dark space.

2. The process of claim 1 wherein the fluorinated olefin polymer is an α-fluoroolefin polymer.

3. The process of claim 2 wherein during the treatment the sputter etching is carried out with the introduction of said atmosphere gas during the discharge treatment from external means.

4. The process of claim 3 wherein the fluorinated olefin polymer is polytetrafluoroethylene or a fluoroethylene propylene polymer.

5. The process of claim 2 wherein during the treatment the sputter etching is carried out without the introduction of said atmosphere gas from any external means during the discharge treatments 6. The process of claim 5 wherein the fluorinated olefin polymer is polytetrafluoroethylene or a fluoroethylene propylene polymer.

7. The process of claim 2 wherein the high frequency current has a frequency of 13.56 MHz.

8. The process of claim 2 wherein the product of the discharge power for the sputter etching and the treating time is 5 to 500 Watt. sec/cm$^2$.

9. The process of claim 2 wherein the product of the discharge power for the sputter etching and the treating time is 80 to 300 Watt. sec/cm$^2$.

10. The process for continuously surface treating a sheet like article of a fluorinated olefin polymer according to claim 1 wherein a sheet take-up and drive device is provided in said chamber.

11. A process for continuously surface treating a sheet like article of a fluorinated olefin polymer according to claim 1 wherein the cathode is a rotary roll cathode.

12. The process of claim 2 wherein the α-fluoroolefin polymer is prepared from perfluorinated α-fluoroolefin monomer or contains hydrogen atoms in addition to fluorine atoms.

13. The process of claim 2 wherein said α-fluoroolefin polymer is a polymer or copolymer having a molecular weight of about $1 \times 10^4$ to about $1 \times 10^7$ and a fluorine content of about 40 to about 76 weight % based on the polymer or copolymer.

14. The process of claim 1 wherein the fluorinated olefin polymer is polytetrafluoroethylene or a fluoroethylene propylene polymer.

15. The process of claim 1 wherein the molded article is a sheet or film.

16. The process of claim 1 wherein said pressure of the atmosphere is 0.001 to 0.15 Torr.

17. The process of claim 1 wherein said pressure of the atmosphere is 0.005 to 0.01 Torr.

* * * * *